United States Patent
Fonte

[19]

[11] Patent Number: 5,815,101
[45] Date of Patent: Sep. 29, 1998

[54] METHOD AND SYSTEM FOR REMOVING AND/OR MEASURING ALIASED SIGNALS

[76] Inventor: Gerard C. A. Fonte, 3985 Tonawanda Creek Rd., East Amherst, N.Y. 14051

[21] Appl. No.: 691,877

[22] Filed: Aug. 2, 1996

[51] Int. Cl.$^6$ ....................................................... H03M 1/00
[52] U.S. Cl. ............................................................. 341/123
[58] Field of Search ..................................... 341/123, 120, 341/110; 324/615, 76.21, 76.24, 76.38

[56] References Cited

U.S. PATENT DOCUMENTS

| | | | |
|---|---|---|---|
| 4,791,577 | 12/1988 | Winter | 364/485 |
| 5,291,140 | 3/1994 | Wagner | 324/615 |

*Primary Examiner*—Brian K. Young
*Attorney, Agent, or Firm*—Hodgson, Russ, Andrews, Woods & Goodyear LLP

[57] ABSTRACT

A system and method for separating aliased signals from non-aliased signals in a sampling system and method wherein the input signal includes frequency components above the Nyquist limit wherein the input signal is sampled at a first sampling rate to provide a first sampled signal, the input is sampled at a second sampling rate different from the first rate to provide a second sampled signal, and the spectral patterns of the first and second sampled signals are compared to separate the aliased signals from the real or non-aliased signals. The aliased signals can be eliminated by removing any spectral component which is not present with both of the sampling rates. While the difference in the sampling rates can be arbitrary, it also can be optimized. Additional samplings at different rates can increase the degree of the correction.

18 Claims, 3 Drawing Sheets

METHOD AND SYSTEM FOR REMOVING AND/OR MEASURING ALIASED SIGNALS

BACKGROUND OF THE INVENTION

This invention relates to the art of signal sampling and analysis, and more particularly to a new and improved method and system for identification and measurement of signals at frequencies above the Nyquist limit and even above the sampling frequency.

The process of transforming an analog waveform into a form that is compatible with a digital system starts with sampling the waveform to produce a discrete pulse waveform. The link between an analog waveform and its sampled version is provided by what is known as the sampling process. The process can be implemented in several ways, and the output of the sampling process is a sequence of pulses derived from the input waveform samples. The analog waveform can be derived from the sequence of pulses, i.e. the pulse waveform, by simple low pass filtering.

An important question is: How closely can a filtered pulse waveform approximate the original waveform? The question is answered using the sampling theorem which states: A bandlimited signal having no spectral components above $f_m$ hertz can be determined uniquely by values sampled at uniform intervals of $T_s$ seconds, where $$T_s \leq \frac{1}{2f_m}$$

This particular statement is also known as the uniform sampling theorem. Stated another way, the upper limit on $T_s$ can be expressed in terms of the sampling rate or sampling frequency, denoted $f_s = {}^1T/_s$. The restriction, stated in terms of the sampling rate or frequency, is known as the Nyquist criterion:

$$f_s \geq 2f_m$$

The sampling rate $f_s = 2f_m$ is also called the Nyquist rate. The Nyquist criterion, or the Nyquist limit, is a theoretically sufficient condition to allow an analog signal to be reconstructed completely from a set of uniformly spaced discrete-time samples.

Aliasing occurs in sampled systems when the input frequency or frequency components exceeds ½ of the sampling frequency. The results are beat-frequencies that can appear as real signals. Up to now, there has been no way of determining the difference between real signals and these aliased signals.

This means that sharp-cutoff low-pass filters are required before the signal gets sampled. Typically, 8-pole (or greater) filters are needed. These filters provide the greatest bandwidth possible. However, they are not without their own problems. At frequencies above a few megahertz (MHz) these filters become difficult to implement. Additionally, the group-delay response of these filters is important. Sharp-cutoff filters typically have poor group-delay characteristics. The result is a trade-off between maximum bandwidth and input filter design. Often, the bandwidth is limited to ⅒ to ¼ of the sampling frequency.

SUMMARY OF THE INVENTION

It would, therefore, be highly desirable to provide a method and system for eliminating the problem of aliasing in sampled signal systems in a manner which does not rely on filtering the input to remove the higher frequencies which give rise to aliasing. In other words, it would be highly desirable to provide such a system and method wherein signals having frequencies above the Nyquist limit can be measured and wherein input anti-aliasing filter requirements can be simplified. It also would be highly advantageous to provide such a system and method that allows aliased signals to be separated from non-aliased signals thereby allowing the aliased signals to be removed or measured.

The present invention provides a system and method for separating aliased signals from non-aliased signals in a sampling system and method wherein the input signal includes frequency components above the Nyquist limit wherein the input signal is sampled at a first sampling rate to provide a first sampled signal, the input is sampled at a second sampling rate different from the first rate to provide a second sampled signal, and the spectral patterns of the first and second sampled signals are compared to separate the aliased signals from the real or non-aliased signals. The aliased signals can be eliminated by removing any spectral component which is not present with both of the sampling rates. While the difference in the sampling rates can be arbitrary, it also can be optimized. Additional samplings at different rates can increase the degree of the correction.

The foregoing and additional advantageous and characterizing features of the present invention will become clearly apparent upon a reading of the ensuing detailed description together with the included drawing wherein:

BRIEF DESCRIPTION OF THE DRAWINGS FIGURES

DETAILED DESCRIPTION OF THE ILLUSTRATED EMBODIMENTS

Figure 2:
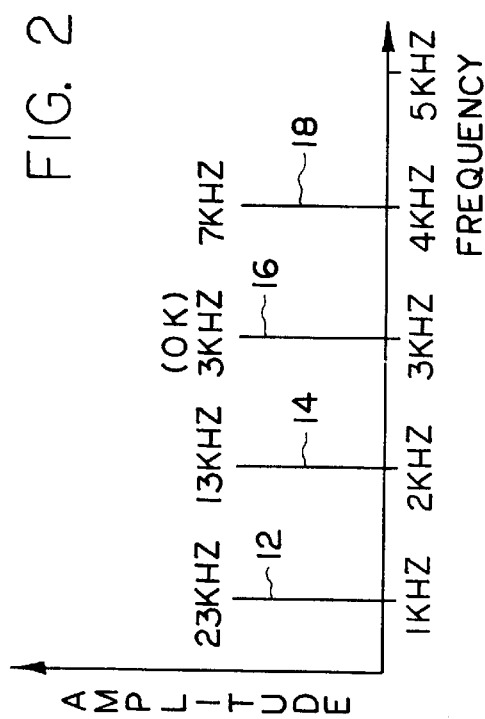
FIG. 2 is a graph illustrating an aspect of the method of the present invention.

The present invention is illustrated by considering the following example of an aliasing problem. Assume a sampled system that samples at 10,000 samples per second (10K KHz) which feeds into a digital signal processor which performs a fast-Fourier transform to produce a frequency spectrum output up to the Nyquist limit of 5 KHz. Now, suppose that a 3 KHz sine wave is applied to the input of the system. What is the result? Since the input frequency is below ½ of the sampling rate (or 5 KHz) there is no aliasing and the spectral output will show a 3 KHz signal.

Now assume a 7 KHz sine wave is added to the input. Since this is above 5 KHz (½ the sampling rate) aliasing will occur. The resulting aliased frequency will be the difference between the sample frequency and the input frequency. In this case, 10 KHz minus 7 KHz yields 3 KHz. So this 7 KHz signal gets shifted onto the real 3 KHz output. The result is that there are two different frequencies included into one spectral line. This clearly is not ideal.

The same thing happens if a 13 KHz sine wave is added to the input. The difference from the sampling rate is 3 KHz which is aliased onto the 3 KHz spectral line. Additionally, for this example, any frequency of N-times the same frequency plus or minus 3 KHz will create a 3 KHz alias, where N is a positive integer. Thus, the combined signals of 3 KHz, 7 KHz, 13 KHz and 23 KHz all create a single spectral line or component of 3 KHz designated 10 in FIG. 1.

Heretofore the only way of eliminating this problem was to filter the input so that these higher-frequencies are removed. As previously described, however, this is not without its own problems.

The question is: how to separate the aliased components from the real signal. The approach according to the present invention is to sample a second time, at a slightly different sample rate and then to compare the spectral patterns. The choice for the different rate is arbitrary. However, techniques that can optimize the selection will be described further on in the specification.

Figure 1:
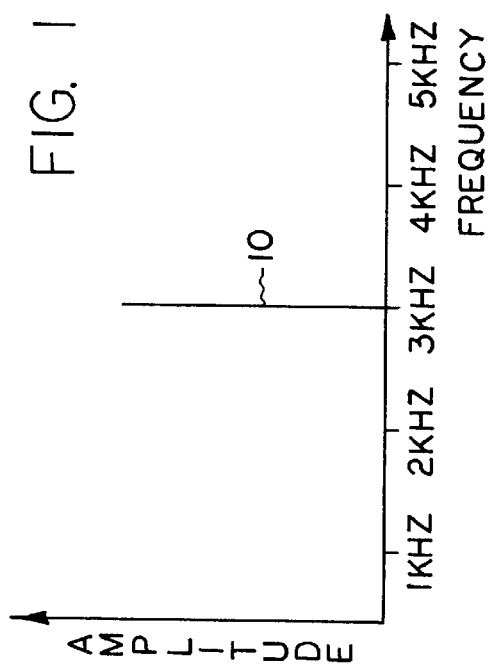
FIG. 1 is a graph illustrating the aliasing problem solved by the present invention.

According to the above example, the combined signals of 3 KHz, 7 KHz, 13 KHz and 23 KHz all create a single spectral line of 3 KHz as shown in FIG. 1. But, suppose that now sampling is done at 11 KHz. The 3 KHz real signal will remain at 3 KHz since there is no aliasing problem. The 7 KHz signal however, will now be aliased to 4 KHz (11 KHz minus 7 KHz). Likewise, the 13 KHz signal will be aliased to 2 KHz (13 KHz minus 11 KHz). The 23 KHz signal first gets aliased to 12 KHz (23 KHz minus 11 KHz) and then this 12 KHz signal gets further aliased down to 1 KHz (12 KHz minus 11 KHz). The result is that the aliased signals now can be easily separated from the real 3 KHz signal by comparing the spectrums of two sampling rates. The spectral lines or components are designated 12, 14, 16 and 18 in FIG. 2.

The aliased signals are removed by simply removing any spectral line that is not present with both of the sampling rates. Of course, it is possible for an aliased signal to move from one real spectral line to another real line (by chance). For example, suppose that there was an additional real spectral line at 2 KHz in the foregoing example. The 13 KHz signal would shift from 3 KHz onto the 2 KHz line. In this case, simply use the smallest value as the real signal. This is because alias signals can only add to a spectral line, they never subtract. Thus, the smallest spectral line value is the best estimate of the real signal.

It is possible, of course, for one spectral line to lose an alias and gain an alias at the same time. For example, consider an input signal that consists of 2 KHz, 3 KHz, 12 KHz and 13 KHz signals. Sampling at 10 KHz will create aliases at 2 KHz and 3 KHz. Sampling at 11 KHz creates aliases at 1 KHz and 2 KHz. Clearly, the 2 KHz spectral line loses one alias and gains a different one when sampled at 11 KHz. This cannot be directly separated out as was the case in the previous example. However, a third sampling at a third rate, for example 10.5 KHz, can catch this. Basically, two sample rates provides first-order correction. Three sample rates provides second-order correction, etc. The technique can be extended as required.

This understanding allows the new sampling rate to be optimized. Once the first signal has been spectrally analyzed, the spectral components can be examined to determine the best new sampling rate, i.e. one that will place alias frequencies onto unoccupied spectral lines. This approach minimizes the number of different sampling rates needed to separate out all of the spectral lines. The alternative, selecting arbitrary new frequencies, can work well with simple spectrums as in the foregoing example.

Figure 3:
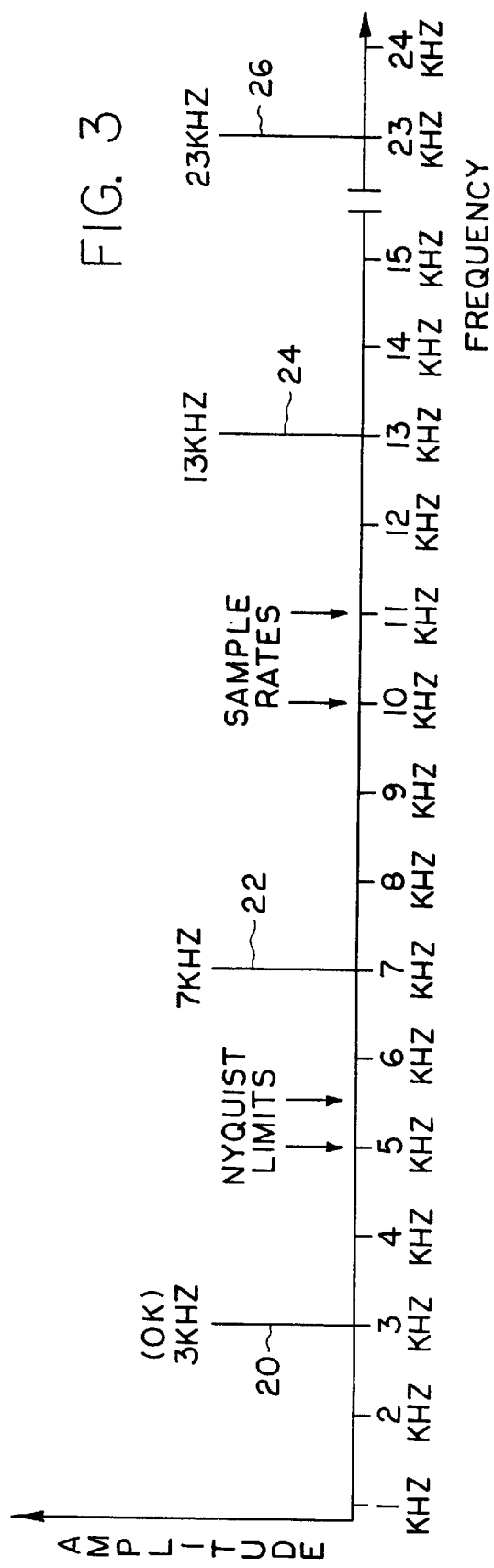
FIG. 3 is a graph illustrating another aspect of the method of the present invention.

Returning to the example, once the aliased spectral lines have been identified, they do not have to be discarded. Indeed, they can be examined and placed in their proper place in the spectrum. This is illustrated in FIG. 3. The real 3 KHz signal is designated 20. For example, we know that one line moved from 3 KHz @ 10 KHz sample rate to 4 KHz @ 11 KHz. One simply works backwards to determine what frequency could produce those aliases. There is one close frequency that will produce an alias of 3 KHz at 10 KHz sample rate and 4 KHz at 1K KHz. That frequency is 7 KHz designated 22 in FIG. 3. Therefore, those two different spectral lines created by two different sampling rates represent the single spectral line of 7 KHz. Thus, this is an example of how a signal can be separated out and identified even though it is above the Nyquist limit. Of course, technically, there is an unlimited number of frequencies that could produce such an alias shift. However, the next closest frequency is 37 KHz (for this example). Note: to create a 3 KHz alias at 10 KHz the frequency must be 7 KHz, 13 KHz, 23 KHz, 27 KHz, 33 KHz, 37 KHz, 43 KHz, 47 KHz, etc.

The closest frequency for the 2 KHz alias (at 11K KHz) is 13 KHz designated 24 in FIG. 3. The next closest alias that would match the pattern would be 42 KHz. Realistically, of course, any system is band-limited. The 42 KHz signal is 8 times greater than the Nyquist limit, 4 times greater than the sampling frequency and 3 times greater than the lower alias frequency (13 KHz). Such frequency components are fairly easy to remove from the input signal and can be assumed to be absent from this example. Therefore, the alias signal must be 13 KHz (rather than 42 KHz or greater). Thus, a signal component has been identified and measured that is above the sampling rate.

The closest frequency for the 1 KHz alias pattern is 23 KHz designated 26 in FIG. 3 with the next possibility at 43 KHz. Since the difference between the two aliases is only a factor of two it becomes more difficult to filter out the higher frequency component while leaving the lower frequency component. Note, however, that the higher frequency is more than four times sample rate and more than 8 times the Nyquist limit. It is not possible to sort out which alias is which given just two sampling frequencies. Nevertheless, it is known that these signals are aliases and what their minimum frequency must be. Additional sampling rate(s) can be used to separate out these two aliases.

The method of the present invention thus provides for the identification and measurement of signals above the Nyquist limit and even above the sampling frequency. Multiple sampling rates separate out the aliased frequencies. Since, for any given sampling change, there is a defined change to the aliased frequencies, the aliased frequencies can be identified by a simple calculation. An illustration of such a calculation is presented in the following six steps.

1. An alias (Fa) is created when a signal (Fx) is higher than ½ the sampling rate (Fs1).
2. Fa=(N*Fs1)−Fx or Fa=(N*Fs1)+Fx where N is a positive integer.
3. Given a system that is bandwidth limited to twice the sampling rate (assumed for the rest of the calculations), a maximum of 3 alias signals for each real signal may be present: Fa1=(1*Fs1)31 Fx, Fa2=(1*Fs1)+Fx and Fa3=(2*Fs1)−Fx. Note: Fa=(2*Fs1)+Fx is greater than twice the sampling rate and exceeds the defined bandwidth.) In general, the maximum number of aliases is [2*(system bandwidth/Fs1)]−1.
4. Sampling at a different rate (Fs2) provides a different set of aliases shifted in frequency (Fd). Fd=+N (Fs1−Fs2) or Fd=−N(Fs1−Fs2). Note that real (non-aliased) signals do not shift in frequency. Therefore, any signal that changes frequency is an alias. (These non-aliased frequencies are ignored for the rest of the calculations.)

5. In this case, any alias must be one of three possible frequencies as shown in step 3. The real frequency must satisfy the alias formula for both sample rates.

6. In the case where many signal frequencies are present and alias identification is difficult, multiple sample frequencies can be used. Again, the real frequency must satisfy the alias formula for all sample rates.

Figure 4:
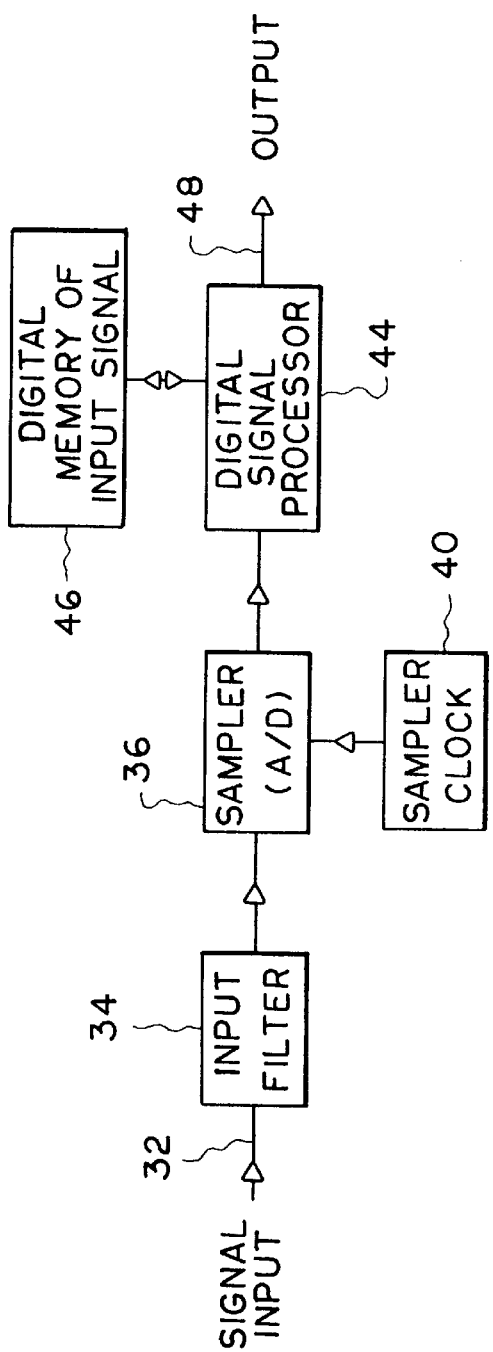
FIG. 4 is a block diagram of a prior art digital signal processing system.

FIG. 4 shows a prior art digital signal processing system wherein aliased signals cannot be identified or measured. An analog input signal is applied to the input 32 of a filter 34, the output of which is applied to the input of a sampler such as an analog-to-digital converter 36. The rate of sampling is controlled by a clock 40 connected to sampler 36. The output of sampler 36 is connected to the input of a digital signal processor 44 which performs a fast-Fourier transform to produce a frequency spectrum output up to the Nyquist limit. A digital memory 46 connected to processor 44 stores the digital version of the sampled input signal. Aliased signals appearing in the output 48 of digital signal processor 44 cannot be identified or measured.

Figure 5:
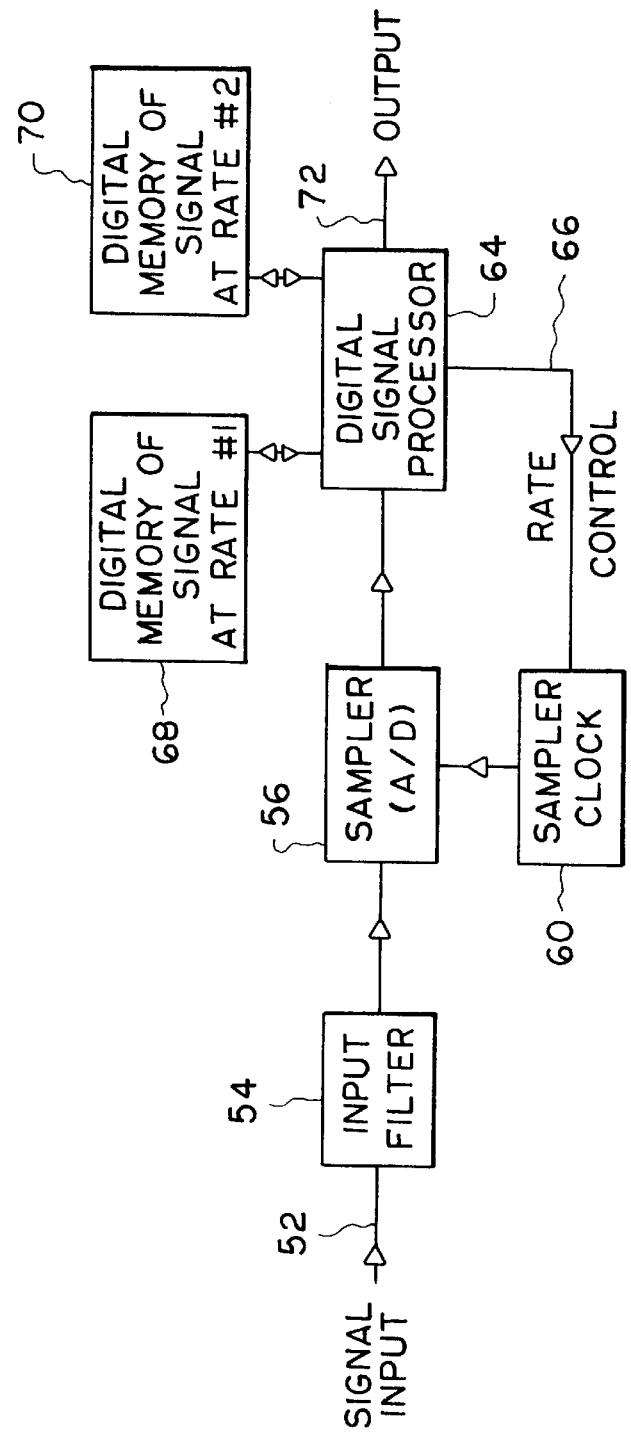
FIG. 5 is a block diagram of a system according to one embodiment of the present invention.

A system according to one embodiment of the present invention is shown in FIG. 5. It is for use with repetitive signals and samples the input signal at different rates and the resulting change in alias frequencies is compared with the original. An input signal is applied to the input 52 of a filter 54, the output of which is applied to the input of a sampler, such as an analog-to-digital converter 56. The rate of sampling is controlled by a clock 60 connected to sampler 56 which clock is controlled to provide different sampling rates. The output of sampler 56 is connected to the input of a digital signal processor 64 which performs a fast-Fourier transform to produce a frequency spectrum output. Control signals from processor 64 are applied via line 66 to clock 60 for controlling the rate of sampling which, according to the present invention is done at two different rates. First and second memories 68 and 70, respectively, are connected to processor 64 for storing the sampled signals at the two rates of sampling. Processor 64 in conjunction with memories 68 and 70 enables the spectral patterns of the first and second sampled signals at output 72 to be compared so that the aliased signals can be separated from the real or non-aliased signals as illustrated in FIG. 2. Thus, the system of FIG. 5 re-samples the input signal at a different sampling rate so that comparisons against the two sampled signals can be performed. The system of FIG. 5 accordingly requires a repetitive signal and sufficient time to re-sample the input signal.

Figure 6:
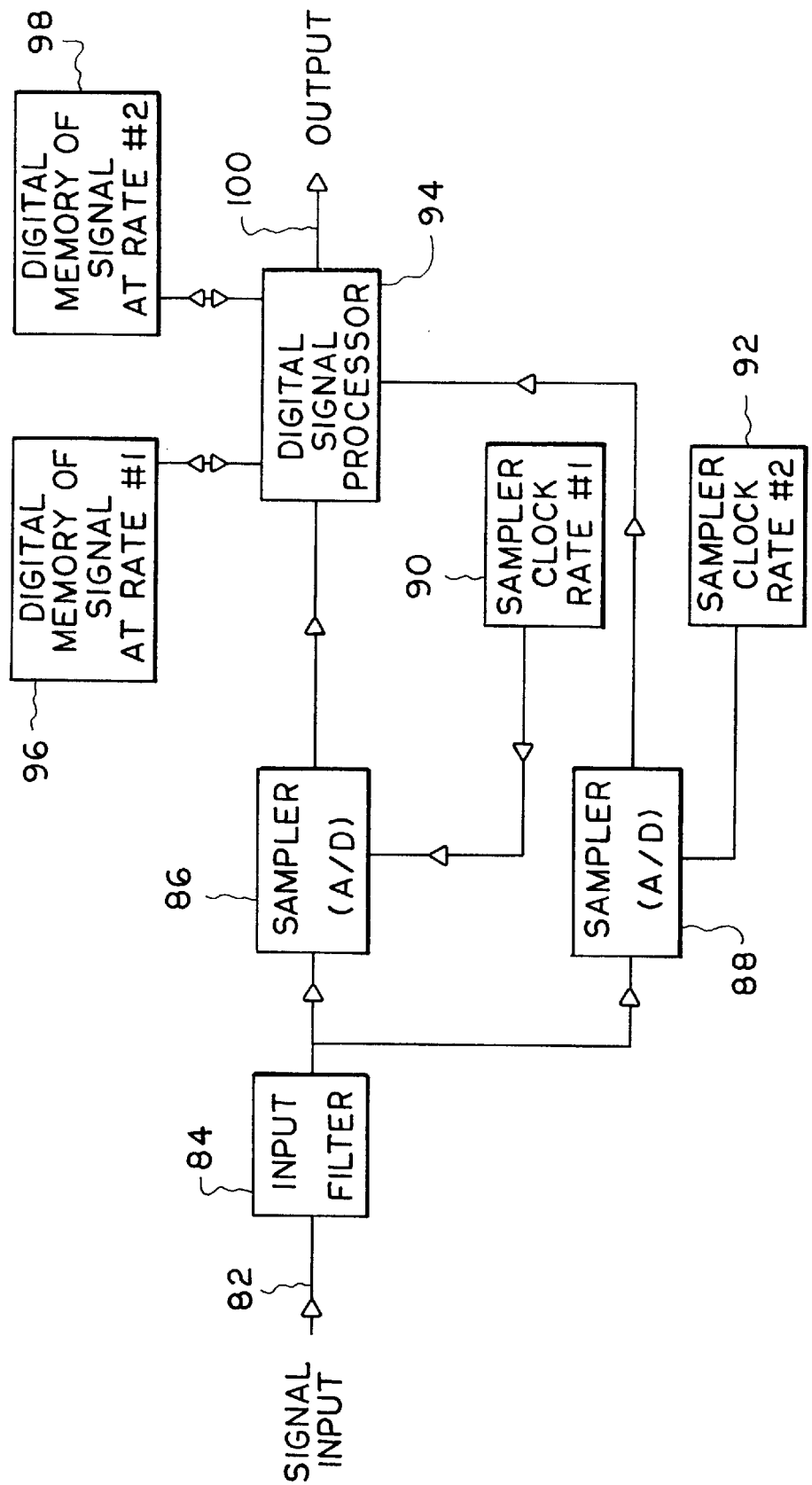
FIG. 6 is a block diagram of a system according to another embodiment of the present invention.

FIG. 6 shows a system according to another embodiment of the present invention for non-repetitive signals. Briefly, two complete sampling systems are provided that can be sampled at different frequencies. An input signal is applied to the input 82 of a filter 84, the output of which is applied to the inputs of first and second samplers 86 and 88, respectively, each of which can be an analog-to-digital converter. A first clock 90 is connected to sampler 86 for sampling the input signal at a first rate. A second clock 92 is connected to sampler 88 for sampling the input signal at a second rate which is different from the first rate. The outputs of the samplers 86 and 88 are connected to inputs of a digital signal processor 94 which performs a fast-Fourier transform to produce a frequency spectrum output. First and second memories 96 and 98, respectively, are connected to processor 94 for storing the sampled signals at the two rates of sampling. Processor 94 in conjunction with memories 96 and 98 enables the spectral patterns of the first and second sampled signals at output 100 to be compared so that the aliased signals can be separated from the real or non-aliased signals as illustrated in FIG. 2. In the system of FIG. 6, while separate and independent sample clocks 90 and 92 are provided, they can be controlled by processor 94 if desired.

In the systems of FIGS. 5 and 6, the digital signal processors 44 and 64 both operate to compare the spectral patterns of the input signal sampled at the two sampling rates to separate the aliased signals from the non-aliased signals. Both digital signal processors 44 and 64 operate to eliminate the aliased signals by removing any spectral components which are not present with both of the two sampling rates. The foregoing can be readily accomplished by computer-controlled signal processors which are readily available commercially and well-known to those skilled in the art.

The system and method of the present invention does not require a fast-Fourier transform to be performed in the digital signal processing. For example, in a narrow-band digital filter with a real signal and an alias present, it would be possible to change the sampling rate such that the aliased signal is shifted out of the passband of the filter. Such digital tuning does not require a fast-Fourier transform and can be accomplished at high speed.

While in theory there is no limit to the highest frequency that can be identified, in real systems practical considerations dictate that limits are needed. Obviously, there are an infinite number of aliases with an infinite bandwidth which will take an infinite amount of processing time to analyze. But, real systems are band-limited.

Conventional systems require sharp-cutoff low-pass filters to eliminate aliasing frequencies from entering the system while maintaining maximum bandwidth. A perfect filter could be set to the Nyquist limit (½ the sampling rate) and work well with a bandwidth that is ½ the sampling rate. Unfortunately, real filters are not perfect. For example, in order to eliminate aliased frequencies below detectable limits in a 12-bit-resolution (1 part in 4096 or about 72 dB) system a 12-pole filter set to ¼ the sampling rate would be needed (bandwidth limited to 25% of the sampling rate). Such a filter is very difficult to achieve practically. A simple 1-pole filter would limits the bandwidth, unfiltered, to 4% of the sampling rate. In short, the input filtering design is the critical element in defining the bandwidth for conventional systems.

It is ironic that sharp-cutoff filters, typically analog or switched-capacitor, are needed before a digital signal processing system that may act as a sharp-cutoff filter. Nevertheless, that is the case. This requirement limits processor bandwidth and increases circuit complexity.

The approach of the present invention relaxes the requirements on the input filter and allows a bandwidth that actually exceeds the sampling rate as well as the theoretical Nyquist limit. This is true for the input filters 54 and 84 in the systems at FIGS. 5 and 6, respectively. This provides the designer with a greater range of options when designing a sampled system. Using the previous example of a sampling rate of 10 KHz one could use a 4-pole low-pass filter set at the Nyquist limit (5 KHz) which provides a 72 dB cutoff at 40 KHz (adequate for a 12 bit system). In other words, a much simpler filter can be used which provides 100% of the theoretical Nyquist maximum bandwidth (or greater).

Table I presents a comparison of input filters in a conventional system versus the system of the present invention.

TABLE I

| FILTER TYPE | CUTOFF FREQ. | BANDWIDTH (UNFILTERED) | COMMENTS |
|---|---|---|---|
| \multicolumn{4}{c}{CONVENTIONAL SYSTEM (SAMPLE RATE 10 KHz) (12 BIT SYSTEM/72 dB)} | | | |
| PERFECT | 5.00 KHz | 5.00 KHz | THEORETICAL/IMPOSSIBLE |
| 12 POLE | 2.50 KHz | 2.50 KHz | DIFFICULT |
| 4 POLE | 1.25 KHz | 1.25 KHz | EASY |

| FILTER TYPE | CUTOFF FREQ. | BANDWIDTH | COMMENTS |
|---|---|---|---|
| \multicolumn{4}{c}{SYSTEM OF THE PRESENT INVENTION (SAMPLE RATE 10 KHz) (12 BIT SYSTEM/72 dB)} | | | |
| 4 POLE | 5.00 KHz | 5.00 KHz | ALIASES REMOVED |
| 4 POLE | 5.00 KHz | 12–20 KHz | ALIASED REPLACED WITH ESTIMATES |

The system of the present invention allows reconstruction of the alias amplitudes by correcting for the effect of the input filter on the signal.

Additionally, the filter action on the aliased frequencies can be calculated and the apparent bandwidth extended to include these frequencies. For example, the 4-pole filter in Table I, will provide 48 dB loss at 15 KHZ. Thus, an alias identified at 15 KHz will have been reduced by the input filter by 48 dB. Therefore, increasing that spectral line by 48 dB compensates for the filter. The result is an calculated estimate of signal amplitude. Again, note that a bandwidth which is higher than the sampling frequency can be achieved.

The approach of the present invention will work well whenever there is a limited number of frequency components in a signal. Obviously complex signals containing many frequency components require more analysis than signals containing few components. The problem that occurs is the ability to identify spectral lines that actually change. When alias lines move from one populated spectral line to another it becomes more difficult to isolate the aliased component. The worst situation would be a non-repetitive noise signal. In this case, all spectral components exist, thus any change would be from one spectral line to another. However, the approach of the present invention would not abruptly fail with complex signals, it would simply degrade in a predictable manner as the signals became more complex.

The technique according to the present invention of changing the sample rate and comparing spectra allows aliased components to be identified and measured. This permits wider bandwidth, and at the same time, permits simpler input filtering. This approach means significant improvements in analytical methods without a corresponding need for improved electronic devices.

It is therefore apparent that the present invention accomplishes its intended objects. While embodiments of the present invention have been described in detail, that is for the purpose of illustration, not limitation.

What is claimed is:

1. A method for separating aliased signals from non-aliased signals in a sampling method wherein an input analog signal includes frequency components above the Nyquist limit comprising:

a) sampling the input analog signal at a first sampling rate to provide a first sampled signal;
   b) sampling the input analog signal at a second sampling rate different from the first sampling rate to provide a second sampled signal;
   c) said steps of sampling the input analog signal at said first and second sampling rates being performed asynchronously; and
   d) comparing the spectral patterns of the first and second sampled signals to separate the aliased signals from the non-aliased signals.

2. The method according to claim 1, wherein the aliased signals are eliminated by removing any spectral component which is not present with both of the sampling rates.

3. The method according to claim 2, wherein the smallest spectral component is utilized as the best estimate of a real signal.

4. A system for separating aliased signals from non-aliased signals in a sampling method wherein an input analog signal includes frequency components above the Nyquist limit comprising:

a) means for sampling the input analog signal at a first sampling rate to provide a first sampled signal;
   b) means for sampling the input analog signal at a second sampling rate to provide a second sampled signal;
   c) said means for sampling the input analog signal at said first sampling rate and said means for sampling the input analog signal at said second sampling rate operating asynchronously; and
   d) so that the spectral patterns of the first and second sampled signals can be compared to separate the aliased signals from the non-aliased signals.

5. The system according to claim 4, including signal processing means operatively associated with said sampling means to enable the spectral patterns of the first and second sampled signals to be compared to separate the aliased signals from the non-aliased signals.

6. The system according to claim 5, wherein said signal processing means performs a fast-Fourier transform on the sampled signals to produce a frequency spectrum output.

7. A system for separating aliased signals from non-aliased signals comprising:

a) signal sampling means having an input and an output;
   b) means for applying an input signal to the input of said sampling means, said input signal being repetitive and including frequency components above the Nyquist limit;
   c) digital signal processing means having an output and having an input connected to the output of said sampling means, said digital signal processing means performing a fast-Fourier transform on the sampled signal to provide a frequency spectrum output;
   d) clock means having an input and having an output connected to said sampling means for controlling the rate of sampling;
   e) said digital signal processing means including means operatively connected to said input of said clock means for controlling said clock means to cause said sampling means to sample said input signal at first and second sampling rates different from each other; and
   f) said digital signal processing means including memory means for storing signals sampled at said first and second rates;
   g) so that the spectral patterns of the input signal sampled at said first and second sampling rates can be compared to separate the aliased signals from the non-aliased signals.

8. The system according to claim 7, wherein said digital signal processing means includes mean for comparing the spectral patterns of the input signal sampled at said first and second sampling rates to separate the aliased signals from the non-aliased signals.

9. The system according to claim 8, wherein said digital signal processing means includes means for eliminating the aliased signals by removing any spectral component which is not present with both of said first and second sampling rates.

10. The system according to claim 7, wherein said means for applying an input signal comprises filter means having a bandwidth exceeding the sampling rate and exceeding the Nyquist limit.

11. The system according to claim 7, wherein said sampling means comprises analog-to-digital converter means.

12. A system for separating aliased signals from non-aliased signals comprising:
   a) first signal sampling means having an input and an output;
   b) first clock means connected in controlling relation to said first sampling means for causing signal sampling at a first sampling rate;
   c) second signal sampling means having an input and an output;
   d) second clock means connected in controlling relation to said second sampling means for causing signal sampling at a second sampling rate different from said first sampling rate;
   e) means for applying an input signal to the inputs of said first and second signal sampling means, said input signal being non-repetitive and including frequency components above the Nyquist limit; and
   f) digital signal processing means having an output and having inputs connected to the outputs of said first and second sampling means, said digital signal processing means performing a fast-Fourier transform on the sampled signal to provide a frequency spectrum output, said digital signal processing means including memory means for storing signals sampled at said first and second rates;
   g) so that the spectral patterns of the input signal sampled at said first and second sampling rates can be compared to separate the aliased signals from the non-aliased signals.

13. The system according to claim 12, wherein said digital signal processing means includes mean for comparing the spectral patterns of the input signal sampled at said first and second sampling rates to separate the aliased signals from the non-aliased signals.

14. The system according to claim 13, wherein said digital signal processing means includes means for eliminating the aliased signals by removing any spectral component which is not present with both of said first and second sampling rates.

15. The system according to claim 12, wherein said means for applying an input signal comprises filter means having a bandwidth exceeding the sampling rate and exceeding the Nyquist limit.

16. The system according to claim 12, wherein said sampling means comprises analog-to-digital converter means.

17. A method for separating aliased signals from non-aliased signals in a sampling method wherein an input signal includes frequency components above the Nyquist limit comprising:
   a) sampling the input signal at a first sampling rate to provide a first sampled signal;
   b) sampling the input signal at a second sampling rate different from the first sampling rate to provide a second sampled signal;
   c) sampling the input signal at a third sampling rate different from the first and second sampling rates to provide a second-order correction when one spectral component loses an alias and gains an alias at the same time during sampling; and
   d) comparing the spectral patterns of the sampled signals to separate the aliased signals from the non-aliased signals.

18. A method for separating aliased signals from non-aliased signals in a sampling method wherein an input signal includes frequency components above the Nyquist limit comprising:
   a) sampling the input signal at a first sampling rate to provide a first sampled signal;
   b) after the input signal is sampled at the first sampling rate spectrally analyzing the sampled signal and examining the frequency components to select a second sampling rate which will place the frequency components of aliased signals in unoccupied spectral locations;
   c) sampling the input signal at a second sampling rate different from the first sampling rate to provide a second sampled signal; and
   d) comparing the spectral patterns of the first and second sampled signals to separate the aliased signals from the non-aliased signals.

* * * * *